US005296777A

United States Patent [19]

Mine et al.

[11] Patent Number: 5,296,777

[45] Date of Patent: Mar. 22, 1994

[54] ULTRASONIC PROBE

[75] Inventors: Yoshitaka Mine; Susumu Hiki; Makoto Hirama, all of Ootawara, Japan

[73] Assignee: Kabushiki Kaisha Toshiba, Kawasaki, Japan

[21] Appl. No.: 908,872

[22] Filed: Jul. 7, 1992

Related U.S. Application Data

[63] Continuation of Ser. No. 627,915, Dec. 17, 1990, abandoned, which is a continuation of Ser. No. 411,269, Sep. 25, 1989, abandoned, which is a continuation of Ser. No. 151,692, Feb. 2, 1988, abandoned.

[30] Foreign Application Priority Data

| | | | |
|---|---|---|---|
| Feb. 3, 1987 | [JP] | Japan | 62-21764 |
| Mar. 5, 1987 | [JP] | Japan | 62-48963 |
| Jun. 26, 1987 | [JP] | Japan | 65-157924 |

[51] Int. Cl.[5] .................. H01L 41/08

[52] U.S. Cl. .................. 310/334; 310/327; 310/366

[58] Field of Search .................. 310/334–337, 310/326, 327, 366

[56] References Cited

U.S. PATENT DOCUMENTS

| | | | |
|---|---|---|---|
| 4,217,684 | 8/1980 | Brisken et al. | 310/334 X |
| 4,385,255 | 5/1983 | Yamaguchi et al. | 310/334 |
| 4,404,489 | 9/1983 | Larson, III et al. | 310/334 |
| 4,409,510 | 10/1983 | Assenza et al. | 310/334 |
| 4,467,237 | 8/1984 | Piaget | 310/334 |
| 4,479,069 | 10/1984 | Miller | 310/334 |
| 4,604,543 | 8/1986 | Umemura | 310/334 |
| 4,676,106 | 6/1987 | Nagai et al. | 310/334 X |
| 4,701,659 | 10/1987 | Fujii et al. | 310/334 |
| 4,747,192 | 5/1988 | Rokurota | 310/334 X |

FOREIGN PATENT DOCUMENTS

| | | | |
|---|---|---|---|
| 1530783 | 11/1978 | United Kingdom | 310/334 |

*Primary Examiner*—Mark O. Budd
*Attorney, Agent, or Firm*—Finnegan, Henderson, Farabow, Garrett & Dunner

[57] ABSTRACT

An ultrasonic probe has a plurality of ultrasonic transducer elements arranged in a row. A plurality of signal electrodes are provided at one side of the transducer elements. An earth electrode is provided at the other side of the transducer elements. Each of a plurality of signal conductive members is connected to a corresponding signal electrode. An earth conductive member is connected to the earth electrode. The signal conductive members are located close enough to the earth conductive member to sufficiently reduce a mutual inductance generated between said signal conductive members. Therefore, an amount of crosstalk generated between the signal conductive members is reduced.

8 Claims, 12 Drawing Sheets

ULTRASONIC PROBE

This application is a continuation of application Ser. No. 07/627,915, filed Dec. 17, 1990 (now abandoned, which is a continuation of application Ser. No. 07/411,269, filed Sep. 25, 1989 (abandoned), which is a continuation of application Ser. No. 07/151,692, filed Feb. 2, 1988 (abandoned).

BACKGROUND OF THE INVENTION

The present invention relates to an ultrasonic probe having a plurality of ultrasonic transducer elements arranged in a row.

A conventional ultrasonic probe of this type is shown in FIGS. 1 and 2. Ultrasonic probe 1 in FIGS. 1 and 2 has a plurality of ultrasonic transducer elements 2-*l* to 2-*n* arranged in a row. Signal electrodes 3-*l* to 3-*n* are provided at one side of transducer elements 2-*l* to 2-*n*, respectively. Earth electrode 4 is provided at the other side of a plurality of transducer elements 2. Backing member 5 for absorbing an unnecessary ultrasonic wave is provided adjacent to signal electrodes 3-*l* to 3-*n*. A plurality of signal conductive members 6-*l* to 6-*n* for leading an electrical signal are connected to signal electrodes 3-*l* to 3-*n*, respectively. Signal conductive members 6-*l* to 6-*n* extend parallel to each other on the upper surface of backing member 5. Plate-like earth conductive member 7 for earthing the transducer elements is connected to earth electrode 4. Earth conductive member 7 is arranged on the lower surface of backing member 5. Matching layer 8 and acoustic lens 9 are provided adjacent to earth electrode 4.

Therefore, driving signals are sequentially supplied from a transmitter/receiver (not shown) to signal electrodes 3-*l* to 3-*n* through signal conductive members 6-*l* to 6-*n*, at each delay time. As a result, transducer elements 2-*l* to 2-*n* sequentially emit ultrasonic waves toward acoustic lens 9 at predetermined times. These ultrasonic waves are synthesized to define an ultrasonic beam. This ultrasonic beam is deflected and scans a human body. The ultrasonic beam (echo) reflected by an interior of the human body is detected by the transducer elements, and a tomographic image of the human body is displayed on a cathode-ray tube (not shown).

A flow rate of blood flowing through a heart or a blood vessel is sometimes measured by a so-called continuous wave Doppler mode (CWD mode). That is, a plurality of transducer elements, a plurality of earth electrodes, and a plurality of signal conductive members are divided into first group for generating ultrasonic waves and second group for receiving ultrasonic waves (echoes). When driving signals are supplied to signal electrodes of the first group, transducer elements of the first group generate ultrasonic waves continuously. These ultrasonic waves are reflected and detected by transducer elements of the second group. In this case, because of a Doppler effect, a frequency of the reflected ultrasonic wave differs from that of the generated ultrasonic wave. This difference between the two frequencies is proportional to a flow rate of the blood. As a result, this frequency difference is calculated, and the flow rate of the blood is measured and displayed on a cathode-ray tube (not shown).

As shown in FIG. 3, a pair of parallel conductive wires A and B extend perpendicularly to the sheet of the drawing Conductive wires A and B are separated from each other by distance $d$ and have height $h$ from the earth.

Assume that current I is supplied to conductive wires A and B in the same direction. In this case, mutual inductance M represented by the following equation (1) is emerged between conductive wires A and B:

$$M=(\mu/4\pi)\log_e[\{d^2+(2h)^2\}/d^2][H/m] \quad (1)$$

where M is a mutual inductance per unit length between wires A and B and $\mu$ is a permeability of a medium.

It is known that as mutual inductance M is increased, an amount of crosstalk or coupling generated between conductive wires A and B is increased. This crosstalk or coupling is a phenomenon in which an electrical signal transmitting through conductive wire A is emerged in conductive wire B and that an electrical signal transmitting through conductive wire B is emerged in conductive wire A. As is apparent from equation (1), as distance $d$ between conductive wires A and B is reduced or height $h$ between the conductive wires and the earth is increased mutual inductance M is increased, and the crosstalk is increased.

In the conventional ultrasonic probe shown in FIG. 1, assume that a distance between the signal conductive members is $d$ and a height between the signal conductive members and the earth conductive member is $h$.

In the conventional ultrasonic probe, in order to improve directivity of an ultrasonic wave, the transducer elements are arranged close to each other. For this reason, distance $d$ between the signal conductive members is relatively small. Therefore, the crosstalk occurs frequently. In addition, the signal or earth conductive member is arranged on the upper or lower surface of the backing member. For this reason, height $h$ between the signal and earth conductive members is relatively large. Therefore, the crosstalk occurs frequently. That is, since the crosstalk occurs frequently, the ultrasonic wave is unnecessarily generated, and the tomographic image formed by a detected ultrasonic wave sometimes causes artifact. In the CWD mode, crosstalk is sometimes generated between the first and second group signal conductive members. For this reason, the flow rate of the blood is not sometimes accurately measured.

Therefore, a demand has arisen for reducing the crosstalk. However, since the transducer elements are arranged very close to each other, it is very difficult to increase distance $d$ between the signal conductive members. For this reason, a demand has arisen for reducing height $h$ between the signal conductive members and the earth, thereby reducing the crosstalk.

SUMMARY OF THE INVENTION

It is, therefore, an object of the present invention to provide an ultrasonic probe in which a height between signal conductive members and an earth conductive member is reduced to reduce crosstalk, thereby preventing an image for a diagnosis from being obscurely formed and preventing a flow rate of a blood from being inaccurately measured.

According to the present invention, there is provided an ultrasonic probe to be connected to a transmitter/receiver which transmits driving signals to the probe and receives echo signals from the probe, the probe comprising:

an ultrasonic transducer element structure including a plurality of ultrasonic transducer elements which are electrically isolated from each other and arranged in a row, each transducer element for generating an ultrasonic wave toward an examined object at times when the driving signals are applied to the element, and for receiving an echo ultrasonic wave from the examined object for generating the echo signal, wherein each transducer element has opposite sides;

a plurality of signal electrodes corresponding to the transducer elements, each signal electrode provided on one side of a corresponding transducer element for applying the driving signals to the element and receiving the echo signals from the element;

an earth electrode having an inner surface provided on the other side opposite to the one side of at least one of the elements and having an outer flat surface which opposes the inner surface and faces the echo wave, the earth electrode having at least another portion extending to a side of the element different from the other side;

a plurality of signal conductive members, each connected to a corresponding signal electrode, for leading the driving signals from the transmitter/receiver to the signal electrode and the echo signals to the transmitter/receiver; and an earth conductive member for earthing the earth electrode and having an end portion which is electrically connected to the another portion of the earth electrode and a conductive portion electrically isolated from the signal conductive members and extending proximally along at least one of the signal conductive members to limit a mutual inductance between at least two signal conductive members.

These conditions ensure that the connection to the earth electrode is not on the outer flat surface of the earth electrode, an achievement which is advantageous, while at the same time, a reduced mutual inductance is achieved. Therefore, the crosstalk generated between the conductive members is reduced. As a result, the transducer elements are prevented from unnecessarily generating an ultrasonic wave, thereby preventing the image for a diagnosis from being obscurely formed. The flow rate of the blood is accurately measured.

DETAILED DESCRIPTION OF THE PREFERRED EMBODIMENTS

FIGS. 4 to 7 show ultrasonic probe 10 according to a first embodiment of the present invention. Ultrasonic probe 10 includes ultrasonic transducer elements **11-*l* to 11-*n* Transducer elements 11-*l* to 11-*n* are arranged in a row. Electrical insulating members 12 are arranged between adjacent transducer elements. Instead of insulating member 12**, an air gap may be provided between adjacent transducer elements.

Figure 6:
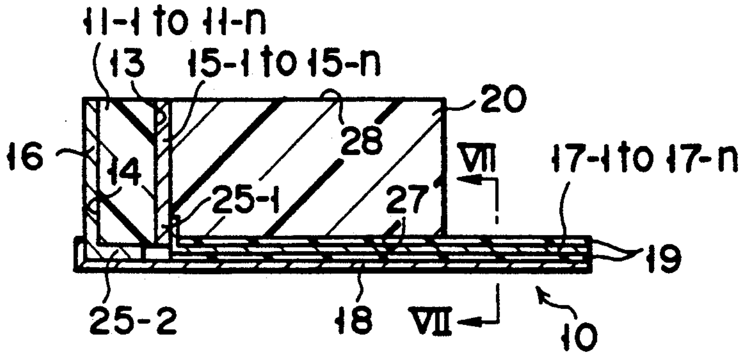
FIG. 6 is a sectional view taken along line VI—VI of FIG. 4 (in which an acoustic lens and a matching layer are omitted)

As shown in FIG. 6, each transducer element has first surface 13 and second surface 14 faced to the first surface. A plurality of plate-like signal electrodes **15-*l* to 15-*n* are provided to first surfaces 13. Plate-like earth electrode 16 is provided to second surfaces 14. That is, signal electrodes 15-*l* to 15-*n* are adhered to transducer elements 11-*l* to 11-*n*, respectively, and earth electrode 16 is adhered to transducer elements 11-*l* to 11-*n*. Earth electrode 16 may be divided into a plurality of pieces, in correspondence to transducer elements 11-*l* to 11-*n***, as is described later.

Figure 4:
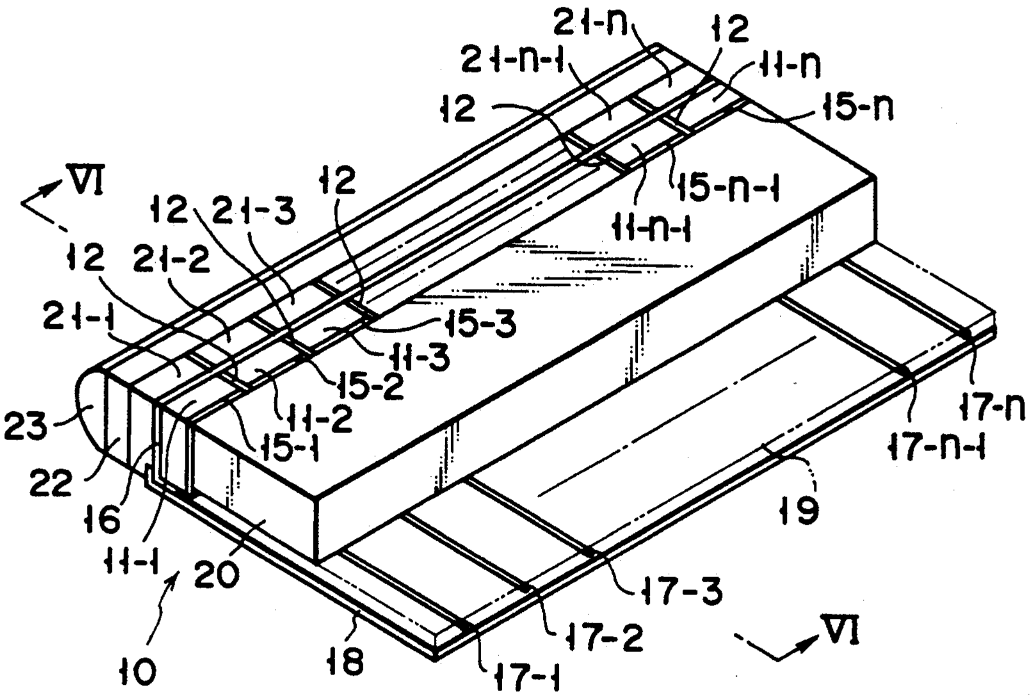
FIG. 4 is a perspective view of an ultrasonic probe according to a first embodiment of the present invention.

As shown in FIGS. 4 and 6, backing member 20 is adhered to signal electrodes **15-*l* to 15-*n* and absorbs an unnecessary ultrasonic wave emitted from the transducer elements. A plurality of signal conductive members 17-*l* to 17-*n*** extend parallel to each other along lower surface (third surface) 27 of backing member 20. Plate-like earth conductive member 18 extends along signal conductive members 17-*l* to 17-*n*.

One end of each of signal conductive members 17-*l* to 17-*n* is brazed or soldered to a corresponding one of lower ends (third ends) 25-1 of signal electrodes 15-*l* to 15-*n*. Lower end (fourth end) 25-2 of earth electrode 16 extends to the lower surfaces of the transducer elements. Earth conductive member 18 is connected to lower end 25-2 of earth electrode 16.

Figure 8:
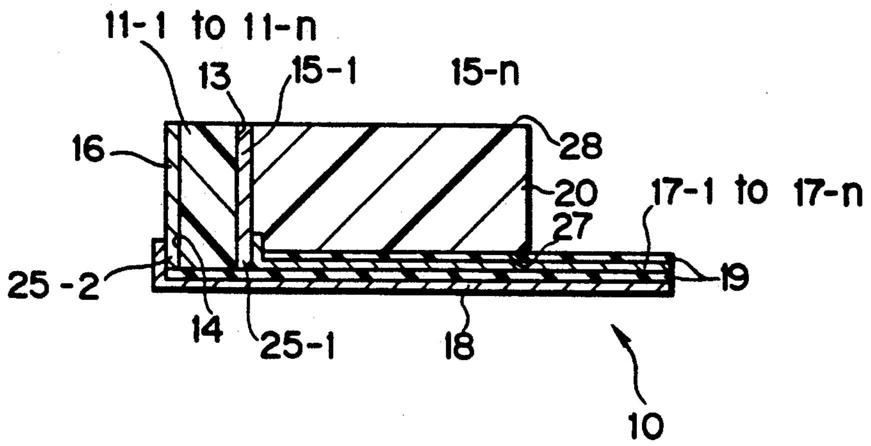
FIG. 8 is a sectional view of an ultrasonic probe according to a first modification of the first embodiment.
Figure 9:
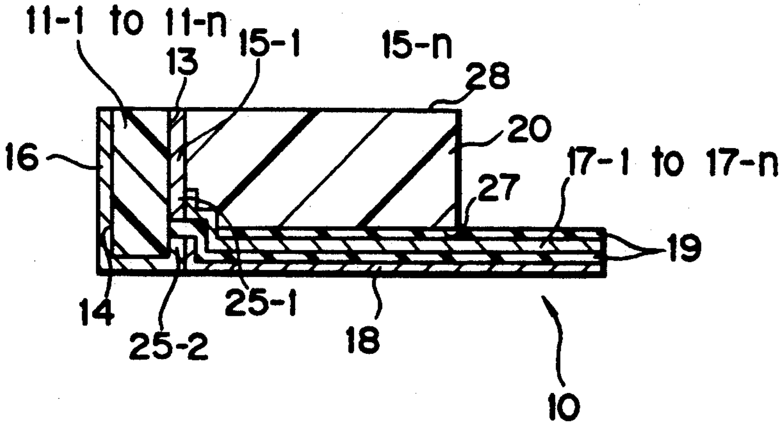
FIG. 9 is a sectional view of an ultrasonic probe according to a second modification of the first embodiment.

FIGS. 8 and 9 show first and second modifications of this embodiment. As shown in FIG. 8, earth electrode 16 is arranged on only second surfaces 14 of the transducer elements. Earth conductive member 18 is connected to lower end 25-2 of earth electrode 16. As shown in FIG. 9, lower end 25-2 extends to a lower surface and a lower portion of first surfaces 13 of the transducer elements. For this reason, a predetermined interval is provided between lower ends 25-1 of signal electrodes 15-*l* to 15-*n* and lower end 25-2. Signal electrodes 15-*l* to 15-*n* and earth electrode 16 are connected to lower ends 25-1 of signal electrodes 15-*l* to 15-*n* and lower end 25-2 of earth electrode 16, respectively.

Figure 5:
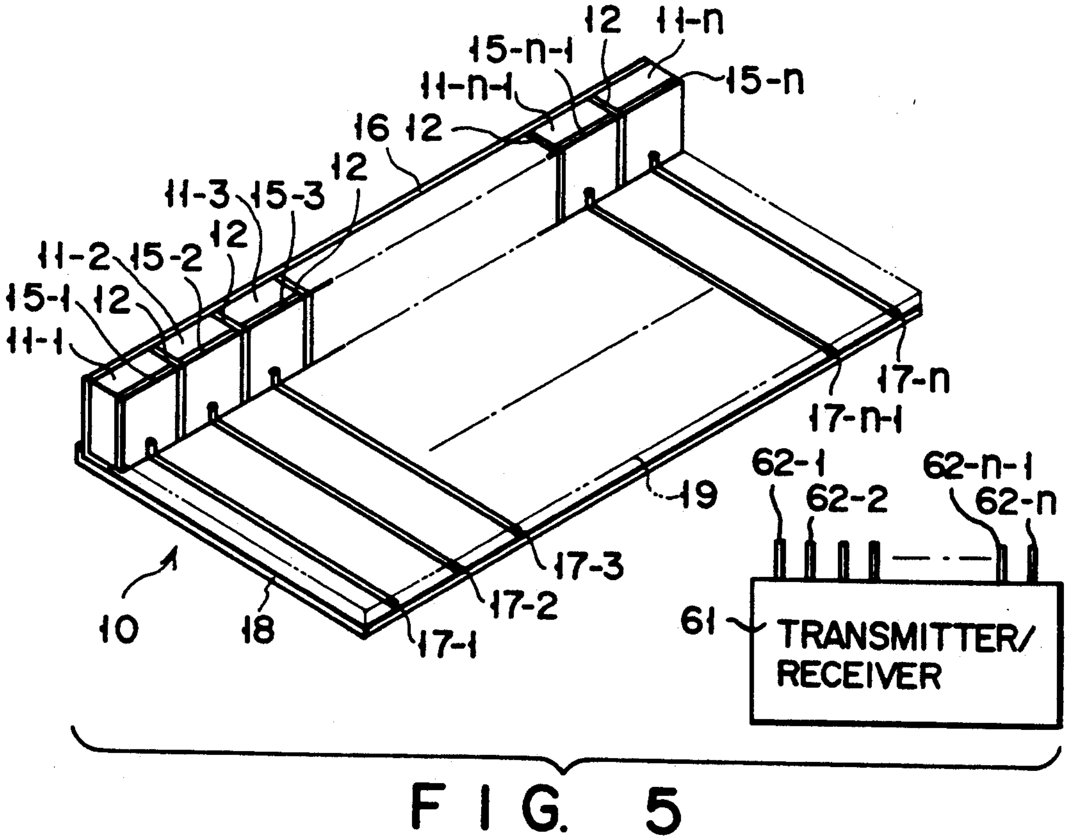
FIG. 5 is a perspective view of the ultrasonic probe shown in FIG. 4 (in which a backing member, an acoustic lens, and a matching layer are omitted)
Figure 7:
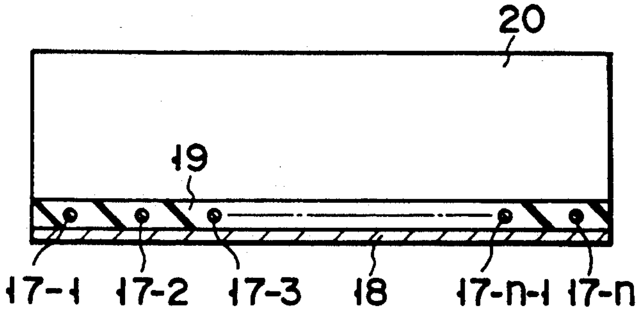
FIG. 7 is a sectional view taken along line VII—VII of FIG. 6.

As shown in FIGS. 5 to 7, signal conductive members 17-*l* to 17-*n* and earth conductive member 18 are electrically isolated from each other by insulating member 19. More specifically, insulating member 19 is a plate-like member formed of a synthetic resin, and signal conductive members 17-*l* to 17-*n* are embedded in insulating member 19. Earth conductive member 18 is arranged on the lower surface of insulating member 19, and backing member 20 is arranged on the upper surface thereof.

A plurality of matching layers 21-*l* to 21-*n* are arranged in correspondence to transducer elements 11-*l* to 11-*n*. Matching layer 22 is arranged on side surfaces of matching layers 21-*l* to 21-*n*. Acoustic lens 23 is arranged on a side surface of matching layer 22. Therefore, an ultrasonic wave generated by the transducer elements is transmitted through matching layers 21-*l* to 21-*n* and 22 and is focused by lens 23.

This ultrasonic probe is connected to transmitter/receiver 61 for transmitting/receiving a signal. More specifically, transmitter/receiver 61 has a plurality of terminals 62-*l* to 62-*n*. Terminals 62-*l* to 62-*n* are connected to signal conductive members 17-*l* to 17-*n*. In a B mode for obtaining a tomographic image, transmitter/receiver 61 transmits driving signals to signal electrodes 15-*l* to 15-*n* through terminals 62-*l* to 62-*n* and signal conductive members 17-*l* to 17-*n*, at predetermined delay times As a result, transducer elements 11-*l* to 11-*n* emit ultrasonic waves to the acoustic lens at predetermined times These ultrasonic waves are synthesized and define an ultrasonic beam. This ultrasonic beam is deflected and scans a human body Transducer elements 11-*l* to 11-*n* receive ultrasonic waves (echoes) reflected by an interior of the human body and generate echo signals. The echo signals are returned to transmitter/receiver 61 through signal electrodes 15-*l* to 15-*n* and signal conductive members 17-*l* to 17-*n*. As s result, a tomographic image of the human body is formed on a cathode-ray tube (not shown).

In the CWD mode for measuring, for example, a flow rate of blood, transducer elements 11-*l* to 11-*n* are divided into first group transducer elements 11-*l* to 11-*k* ($k<n$) for emitting ultrasonic waves and second group transducer elements 11-$k+2$ to 11-*n* for receiving ultrasonic waves (echoes). Signal electrodes 15-*l* to 15-*k*, signal conductive members 17-*l* to 17-*k*, and terminals 62-*l* to 62-*k* of transmitter/receiver 61 belong to the first group. Signal electrodes 15-$k+1$ to 15-*n*, signal conductive members 17-$k+l$ to 17-*n*, and terminals 62-$k+l$ to 62-*n* of transmitter/receiver 61 belong to the second group. In the CWD mode, transmitter/receiver 61 transmits driving signals to first group signal electrodes 15-*l* to 15-*k* through first group signal conductive members 17-*l* to 1 7-*k*. As a result, first group transducer elements 11-*l* to 11-*k* emit ultrasonic waves. These ultrasonic waves are reflected by a flowing blood. The reflected ultrasonic waves (echoes) are received by second group transducer elements 11-$k+1$ to 11-*n*. Transducer elements 11-$k+1$ to 11-*n* emit echo signals. The signal are returned to terminals 62-$k+1$ to 62-*n* through second group signal electrodes 15-$k+1$ to 15-*n* and signal conductive members 17-$k+1$ to 17-*n*. Transmitter/receiver 61 receives the echo signals. Because of the Doppler effect, a frequency of the reflected ultrasonic waves differs from that of the emitted ultrasonic waves. This difference between the two frequencies is proportional to the flow rate of the blood. As a result, this frequency difference is calculated, and the flow rate of the blood is measured and displayed on a cathode-ray tube (not shown).

Signal and earth conductive members 17-*l* to 17-*n* and 18 are arranged on lower surface (third surface) 27 of backing member 20. For this reason, signal and earth conductive members 17-*l* to 17-*n* and 18 are located relatively close to each other. Therefore, coefficient $h$ of equation (1) is reduced, and hence the mutual inductance between signal conductive members 17-*l* to 17-*n* is reduced. In addition, the electrical signal transmitting through one of signal conductive members 17-*l* to 17-*n* is rarely emerged in other signal conductive members 17-*l* to 17-*n*. That is, the crosstalk is reduced. As a result, the transducer elements are prevented from unnecessarily generating an ultrasonic wave, thereby preventing a diagnosis image from being obscurely formed. In the CWD mode, a flow rate of blood is accurately measured.

A degree of a reduced crosstalk level will be described below.

As described above, a relationship between height $h$ between the signal conductive members and the earth conductive member and mutual inductance M is given by equation (1).

Figure 1:
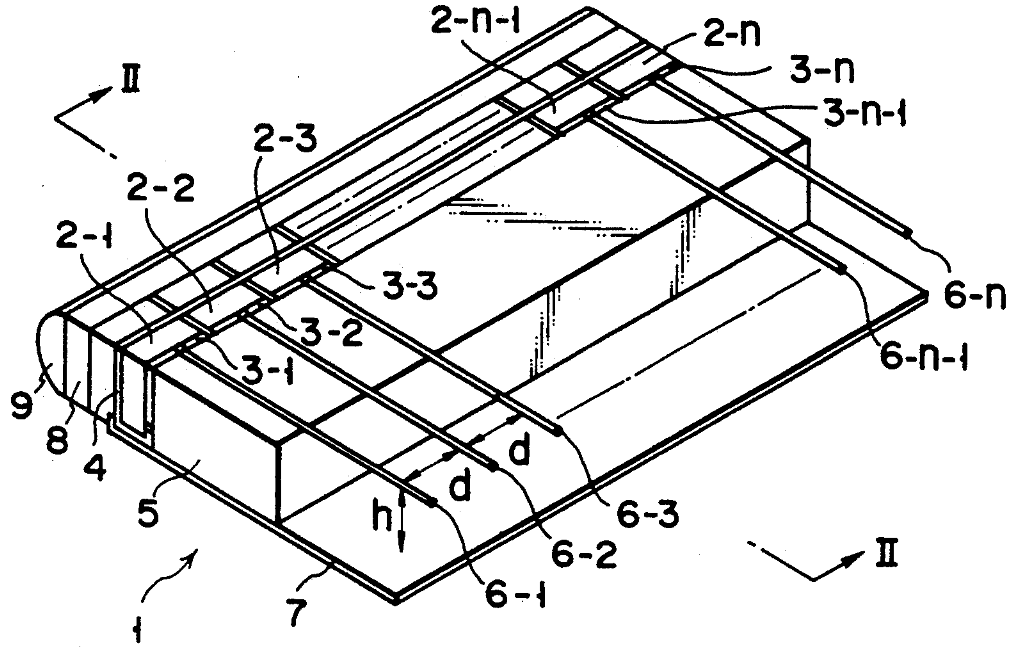
FIG. 1 (PRIOR ART)
FIG. 1 is a perspective view of an ultrasonic probe according to a conventional technique.
Figure 2:
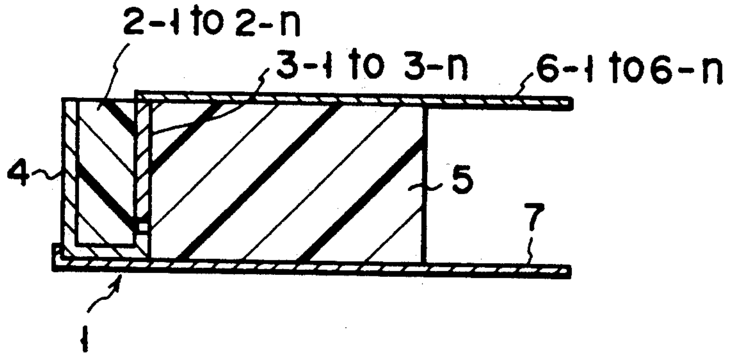
FIG. 2 (PRIOR ART)
FIG. 2 is a sectional view taken along line II—II of FIG. 1 (in which an acoustic lens and a matching layer is omitted)
Figure 3:
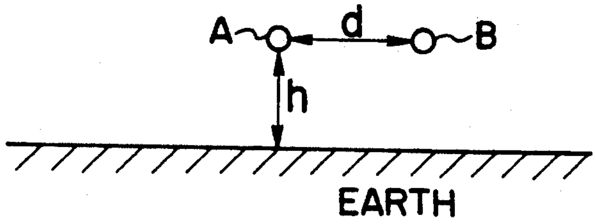
FIG. 3 is a sectional view for explaining a generation mechanism of crosstalk.

In the ultrasonic probe shown in FIGS. 1 and 2, assuming that $h=15$ mm, mutual inductance M is given as follows:

$$M=9.6\times10^{2}\ (nH/m)$$

In the ultrasonic probe according to the first embodiment, assuming that $h=0.2$ mm, mutual inductance M is given as:

$$M=1.3\times10^{2}\ (nH/m)$$

Therefore, the mutual inductance is reduced by −17 dB from that in the conventional probe. For this reason, in this embodiment, the crosstalk level is estimated to be reduced by about −17 dB from that of the conventional probe.

Figure 10:
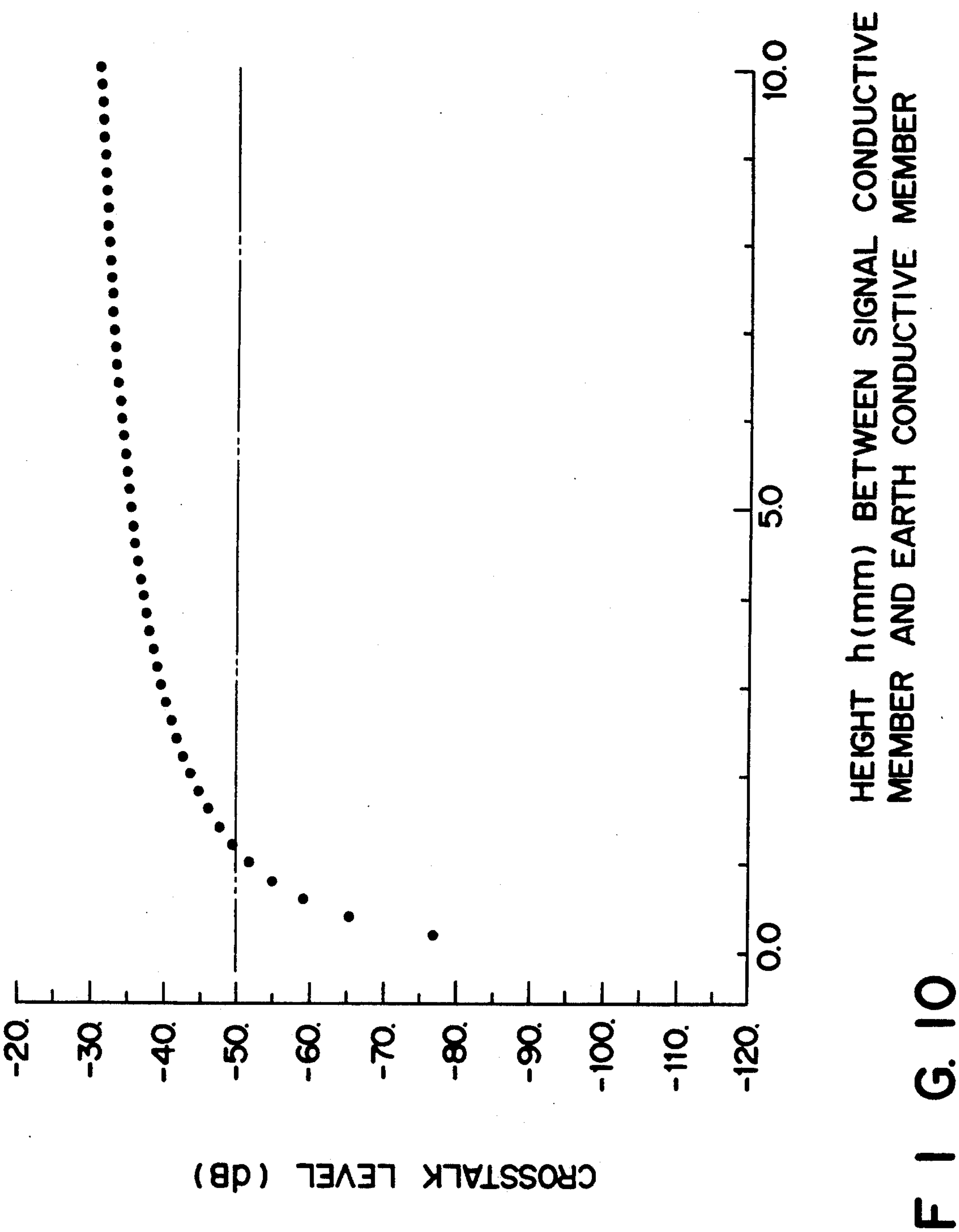
FIG. 10 is a graph which represents a relationship between crosstalk level and height h between signal conductive members and an earth conductive member.

FIG. 10 is a graph showing a relationship between the crosstalk level and height $h$. Note that in the graph of FIG. 10, in an ultrasonic probe having 96 signal conductive members, the crosstalk level of a given one of 48 signal conductive members constituting one group is detected.

As is apparent from the graph of FIG. 10, as height $h$ is reduced, the crosstalk level is reduced. Especially when height $h$ is reduced to 1 mm or less, the crosstalk is significantly reduced. When height $h$ is 10 mm, the crosstalk level is about −30 dB. On the contrary, when height $h$ is about 0.2 mm, the crosstalk level is about 0.2 mm, the crosstalk level is about −77 dB. That is, in this embodiment, since height $h$ is reduced very much, the crosstalk is significantly reduced.

In equation (1), a value of mutual inductance M is proportional to permeability $\mu$ of the medium. The permeability of the backing member is usually five times that of air. In the conventional ultrasonic probe shown in FIGS. 1 and 2, the backing member is provided between the signal conductive members and the earth conductive member. On the other hand, in this embodiment, no backing member is provided between the signal and earth.

Therefore, in this embodiment, the value of mutual inductance M is reduced by reducing height $h$, and is estimated to be further reduced to substantially 1/5 thereof. For this reason, in this embodiment, the crosstalk is estimated to be reduced by an amount corresponding to the reduction in mutual inductance M.

In other words, the signal conductive members, the signal electrodes, the transducer elements, the earth electrode, and the earth conductive member define a closed loop circuit. Generally, as an area of the closed loop circuit is reduced, mutual inductance M is reduced. In the conventional ultrasonic probe shown in FIGS. 1 and 2, the backing member is arranged between the signal conductive members and the earth conductive member. On the other hand, in this embodiment, the signal conductive members are located close to the earth conductive member. For this reason, an area of the loop circuit of this embodiment is smaller than that of the conventional ultrasonic probe. Therefore, the mutual inductance is reduced to suppress generation of the crosstalk.

Figure 11:
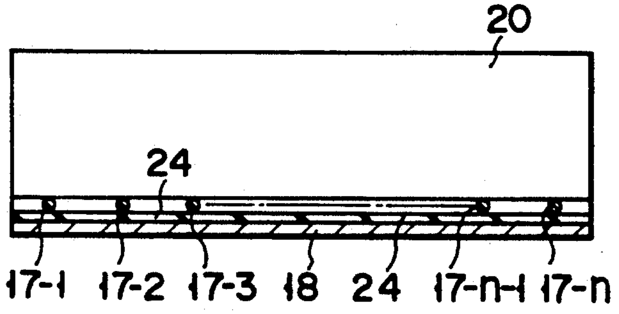
FIG. 11 is a sectional view of a third modification of the first embodiment of the present invention.

FIG. 11 shows third modification of the first embodiment. In this modification, signal conductive members 17-*l* to 17-*n* are not embedded in an insulating member. Insulating layer 24 formed of a resin is placed on the upper surface of earth conductive member 18. A plurality of signal conductive members 17-*l* to 17-*n* are placed on the upper surface of insulating layer 24.

Figure 12:
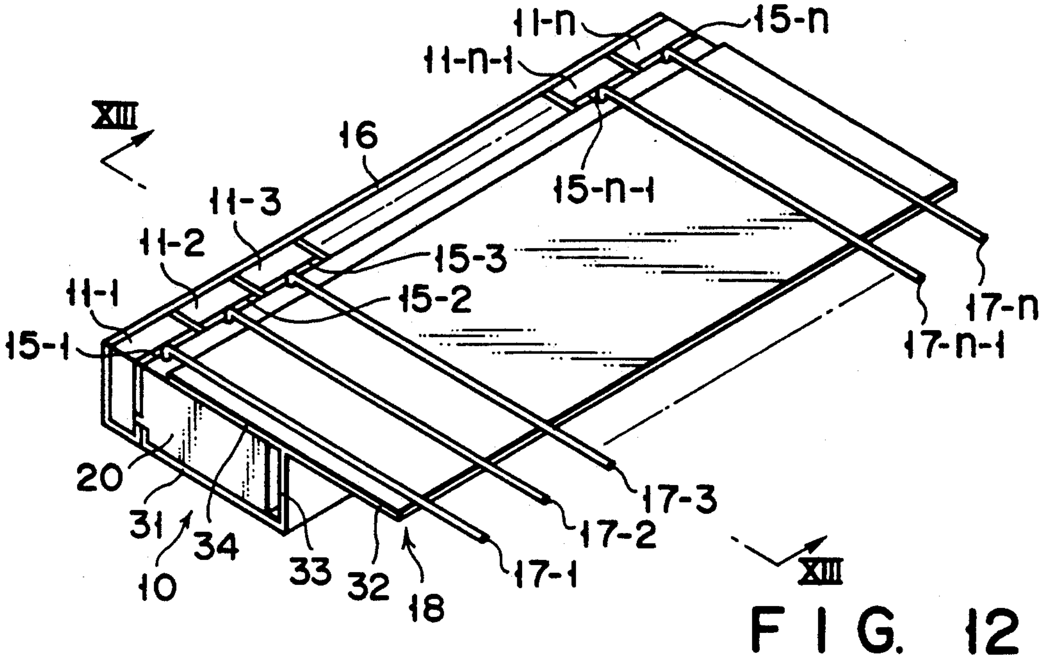
FIG. 12 is a perspective view of an ultrasonic probe according to a second embodiment of the present invention.
Figure 13:
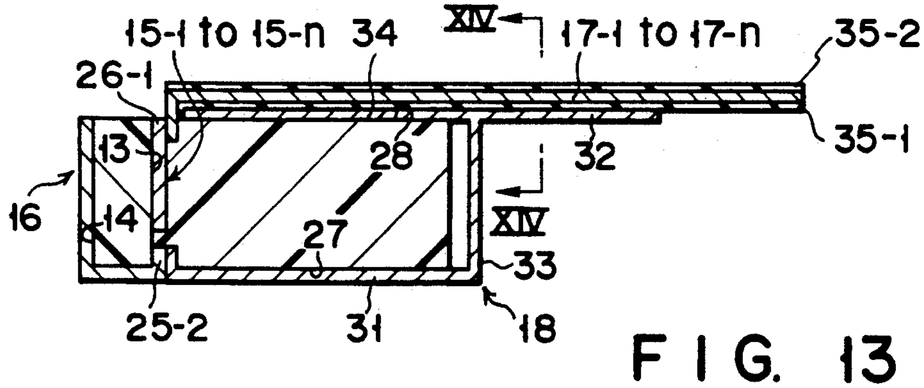
FIG. 13 is a sectional view taken along line XIII—XIII of FIG. 12.
Figure 14:
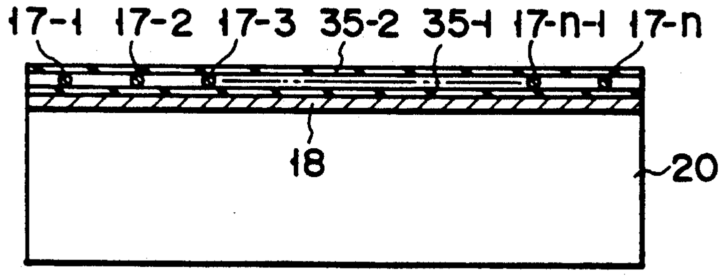
FIG. 14 is a sectional view taken along line XIV—XIV of FIG. 13.

FIGS. 12 to 14 show ultrasonic probe 10 according to a second embodiment of the present invention.

In the second embodiment, as shown in FIG. 12, a plurality of signal electrodes 15-*l* to 15-*n* are adhered to first surfaces 13 of transducer elements 11-*l* to 11-*n*, respectively. Earth electrode 16 is adhered to second surfaces 14 of transducer elements 11-*l* to 11-*n*. Lower end (third end) 25-2 of earth electrode 16 extends to the lower surfaces and first surface lower portions of the transducer elements.

Signal conductive members 17-*l* to 17-*n* extend along upper surface (fourth surface) 28 of backing member 20. The distal end of each of signal conductive members 17-*l* to 17-*n* is bent downward and connected to a corresponding one of upper ends (fourth ends) 26-*l* of signal electrodes 15-*l* to 15-*n*. The distal end of earth conductive member 18 is connected to lower ends (third ends) 25-2 of earth electrode 16.

In the second embodiment, earth conductive member 18 includes first conductive section 31 arranged along lower surface (third surface) 27 of backing member 20, second conductive section 32 extending along the signal conductive members to be far away from the backing member, and third conductive section 33 which couples first and second conductive sections 31 and 32. For this reason, earth conductive member 18 is earthed by first to third conductive sections 31 to 33. Earth conductive member 18 includes fourth conductive section 34 arranged between the signal conductive members and upper surface (fourth surface) 28.

As shown in FIGS. 13 and 14, the signal conductive members are electrically isolated from second and fourth conductive sections 32 and 34 by insulating layer 35-1 formed of a resin. Insulating layer 35-2 is placed on the upper surfaces of the signal conductive members.

Therefore, in the second embodiment, the signal conductive members are located relatively close to second and fourth conductive sections 32 and 34. For this reason, the mutual inductance between the signal conductive members is reduced. As a result, the crosstalk is reduced.

Figure 15:
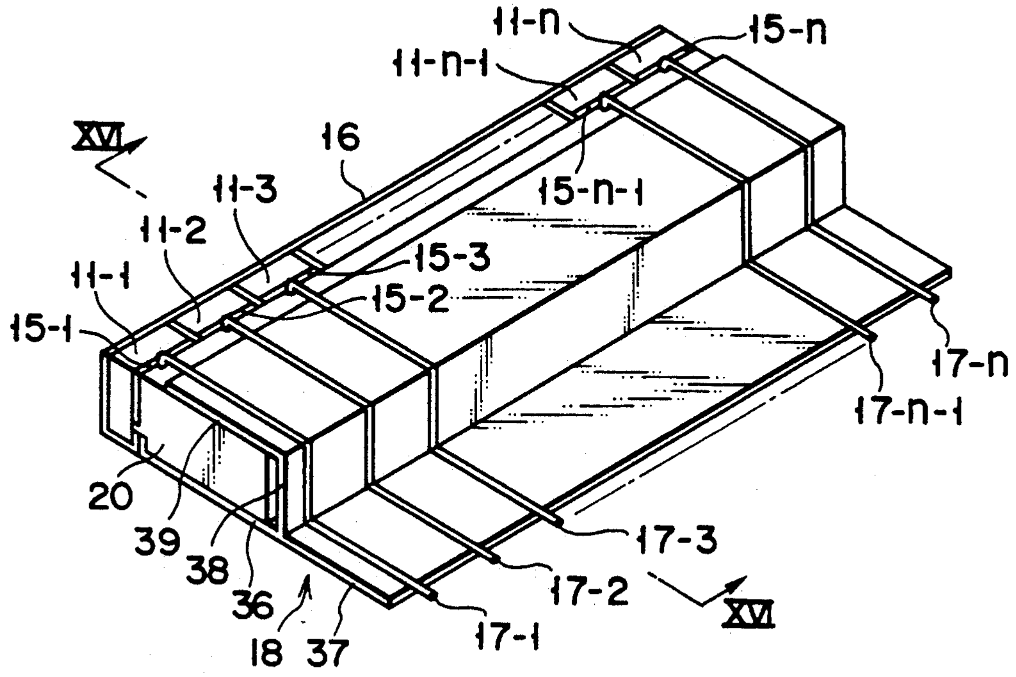
FIG. 15 is a perspective view of an ultrasonic probe according to a first modification of the second embodiment of the present invention (in which an acoustic lens and a matching layer are omitted)
Figure 16:
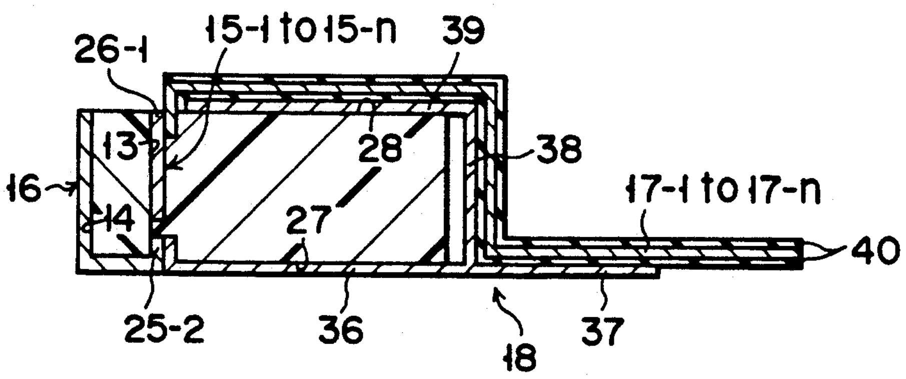
FIG. 16 is a sectional view taken along line XVI—XVI of FIG. 15.

FIGS. 15 and 16 show a first modification of the second embodiment. In this modification, earth conductive member 18 includes first conductive section 36 connected to lower end (third end) 25-2 of earth electrode 16 and arranged along lower surface (third surface) 27 of backing member 20, and second conductive section 37 extending from first conductive section 36 to be far away from backing member 20. Earth conductive member 18 includes fourth conductive section 39 arranged on upper surface (fourth surface) 28 of backing member 20, and third conductive section 38 which couples fourth and first conductive sections 39 and 36.

Signal conductive members 17-*l* to 17-*n* extend along fourth, third, and second conductive sections 39, 38, and 37. These second to fourth conductive sections are electrically isolated from the signal conductive members by insulating layer 40.

Therefore, in this modification, the signal conductive members are located close to the second to fourth conductive sections. As a result, the crosstalk is reduced.

Figure 17:
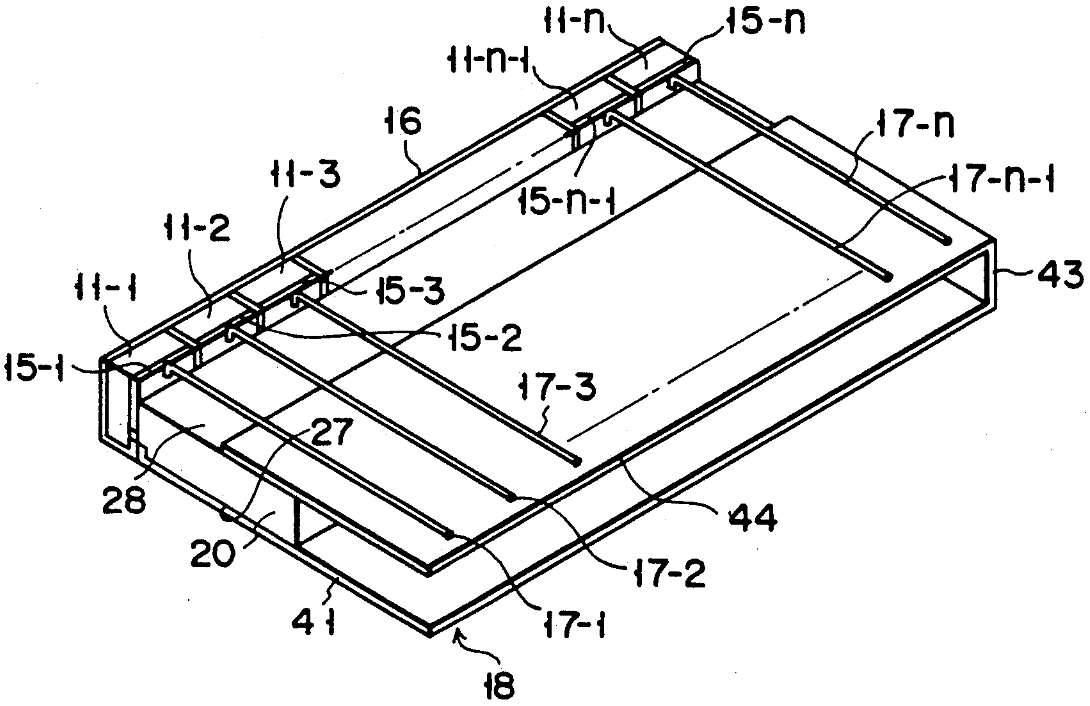
FIG. 17 is a perspective view of an ultrasonic probe according to a second modification of the second embodiment of the present invention (in which an acoustic lens and a matching layer are omitted)

FIG. 17 shows a second modification of the second embodiment. In this modification, earth conductive member 18 includes first conductive section 41 arranged along lower surface (third surface) 27 of backing member 20, fourth conductive section 44 arranged along upper surface (fourth surface) 28 of backing member 20, and third conductive section 43 which couples first and fourth conductive sections. Signal conductive members 17-*l* to 17-*n* extend parallel to each other along fourth conductive section 44.

Therefore, in this modification, the signal conductive members are located close to fourth conductive section 44. As a result, the crosstalk is reduced.

Figure 18:
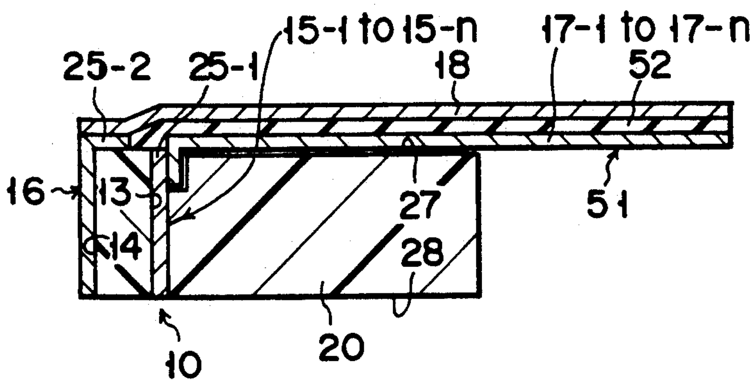
FIG. 18 is a sectional view of an ultrasonic probe according to a third embodiment of the present invention (in which an acoustic lens and a matching layer are omitted)
Figure 19:
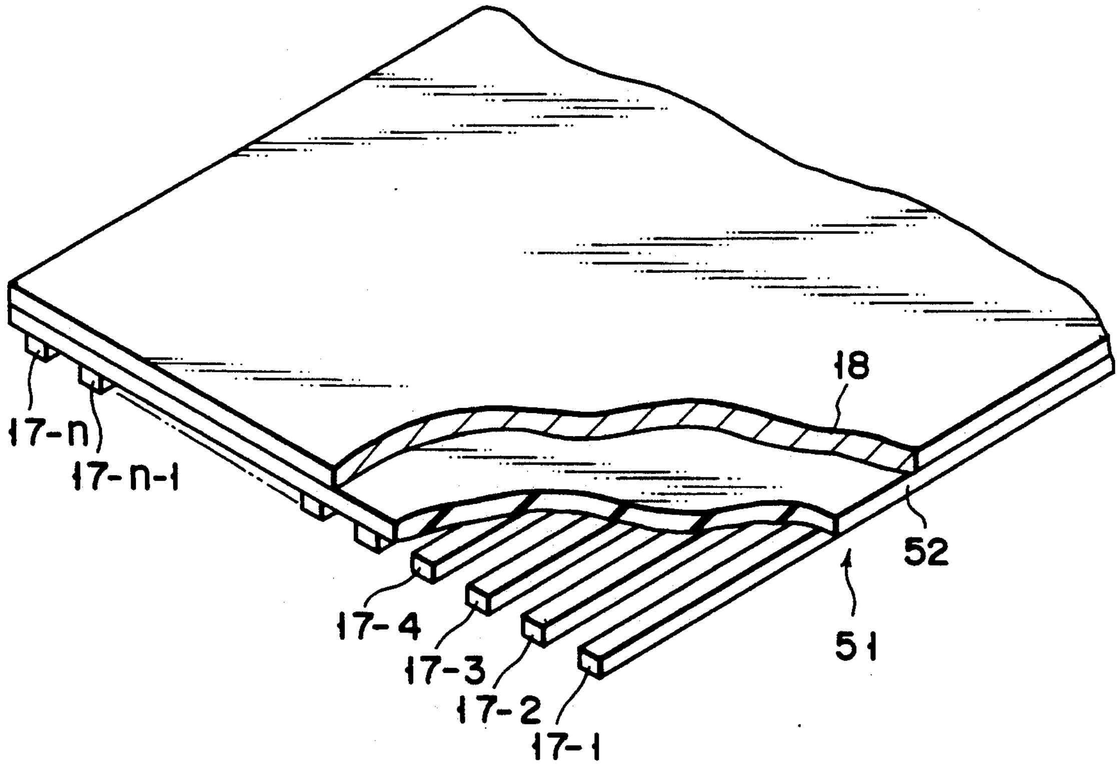
FIG. 19 is a perspective view of a flexible printed circuit board used in the ultrasonic probe shown in FIG. 18.

FIGS. 18 and 19 show ultrasonic probe 10 according to a third embodiment of the present invention.

In the third embodiment, ultrasonic probe 10 includes flexible printed circuit board (FPC) 51. As shown in FIG. 19, FPC 51 includes insulating layer 52 which is a plate-like layer formed of a resin, a plurality of signal conductive members 17-*l* to 17-*n* arranged at one side of insulating layer 52 and extending parallel to each other, and earth conductive member 18 which is a plate-like member arranged at the other side of insulating layer 52.

As shown in FIG. 18, upper end (third end) 25-2 of earth electrode 16 extends to the upper surfaces of transducer elements 11-*l* to 11-*n*. The distal end of earth conductive member 18 of FPC 51 is connected to upper end (third end) 25-2 of earth electrode 16. Each of the distal ends of signal conductive members 17-l to 17-n of FPC 51 is bent and connected to a corresponding one of upper ends (third ends) 25-1 of signal electrodes 15-l to 15-n.

Therefore, in the third embodiment, since the signal conductive members are located close to the earth conductive member, the crosstalk is reduced as in the above embodiments.

Figure 20:
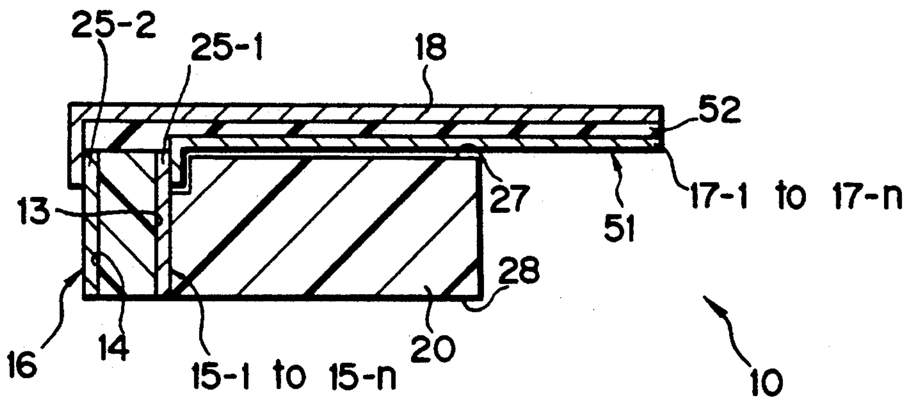
FIG. 20 is a section view of an ultrasonic probe according to a modification of the third embodiment.

FIG. 20 shows a modification of the third embodiment. As shown in FIG. 20, upper end 25-2 of earth electrode 16 need not extend to the upper surfaces of the transducer elements but may be adhered to only second surfaces 14 thereof. The distal end of the earth conductive member is bent downward and connected to upper end 25-2 of earth electrode 16.

Figure 21:
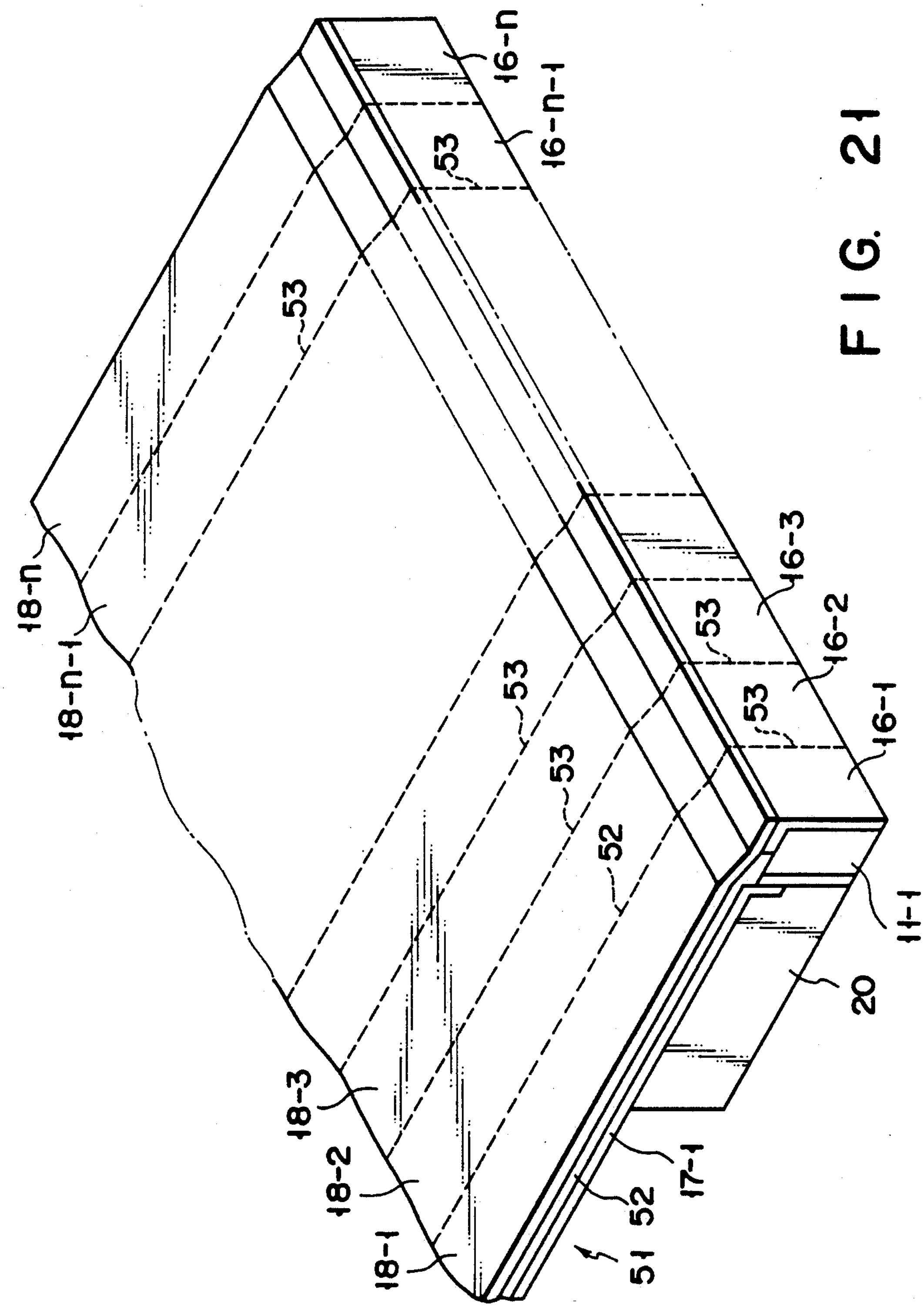
FIG. 21 is a perspective view of an ultrasonic probe according to a fourth embodiment of the present invention (in which an acoustic lens and a matching layer are omitted)

FIG. 21 shows a fourth embodiment of the present invention. In the fourth embodiment, conductive members 17-l to 17-n and 18 of FPC 51 are connected to electrodes 15-l to 15-n and 16, respectively, as in the third embodiment. Earth electrode 16 and earth conductive member 18 are divided into earth electrodes 16-l to 16-n and earth conductive members 18-l to 18-n, respectively, in correspondence to transducer elements 11-l to 11-n. More specifically, cut grooves 53 are formed in earth electrode 16 and earth conductive member 18 and define earth electrodes 16-l to 16-n and earth conductive members 18-l to 18-n. Earth electrodes 16-l to 16-n and earth conductive members 18-l to 18-n are electrically isolated from each other by grooves 53, respectively.

The reason why earth electrode 16 and earth conductive member 18 are divided will be described below.

In the first to third embodiments, each of earth electrode 16 and earth conductive member 18 is not divided but is a single plate. In this case, when an electrical signal transmitted through, e.g., signal conductive member 17-k ($k<n$), is supplied to signal electrode 15-k, transducer element 11-k generates an ultrasonic wave. At this time, the electrical signal is sometimes led from transducer element 11-k to earth electrode 16 and then to earth conductive member 18. At this time, since the earth conductive member has an impedance, a small potential difference is generated between the earth conductive member and the earth of the apparatus by this electrical signal (current). The earth conductive member is not divided. Therefore, the electrical signal is sometimes emerged to, e.g., signal conductive member 17-k+1 where no electrical signal is led. That is, the crosstalk is generated between the signal conductive members. This electrical signal sometimes causes transducer element 11-k+1 to erroneously operate.

On the contrary, in the fourth embodiment, earth electrode 16 and earth conductive member 18 are divided into earth electrodes 16-l to 16-n and earth conductive members 18-l to 18-n, respectively. Earth electrodes 16-l to 16-n and earth conductive members 18-l to 18-n are electrically isolated from each other and earthed, respectively. Therefore, when the electrical signal led through signal conductive member 17-k is supplied to signal electrode 15-k, it is led from transducer element 11-k to earth electrode 16-k and then to only earth conductive member 18-k. As a result, this electrical signal is led to the earth and hence is not emerged to earth conductive member 18-k+1. Therefore, since no crosstalk is generated between the signal conductive members, transducer element 11-k+1 is not erroneously operated.

Therefore, in the fourth embodiment, crosstalk generated when the signal conductive members are separated away from the earth conductive member by a long distance, can be prevented, and at the same time, crosstalk generated when the earth electrode and the earth conductive member are not divided, can be prevented.

Figure 22:
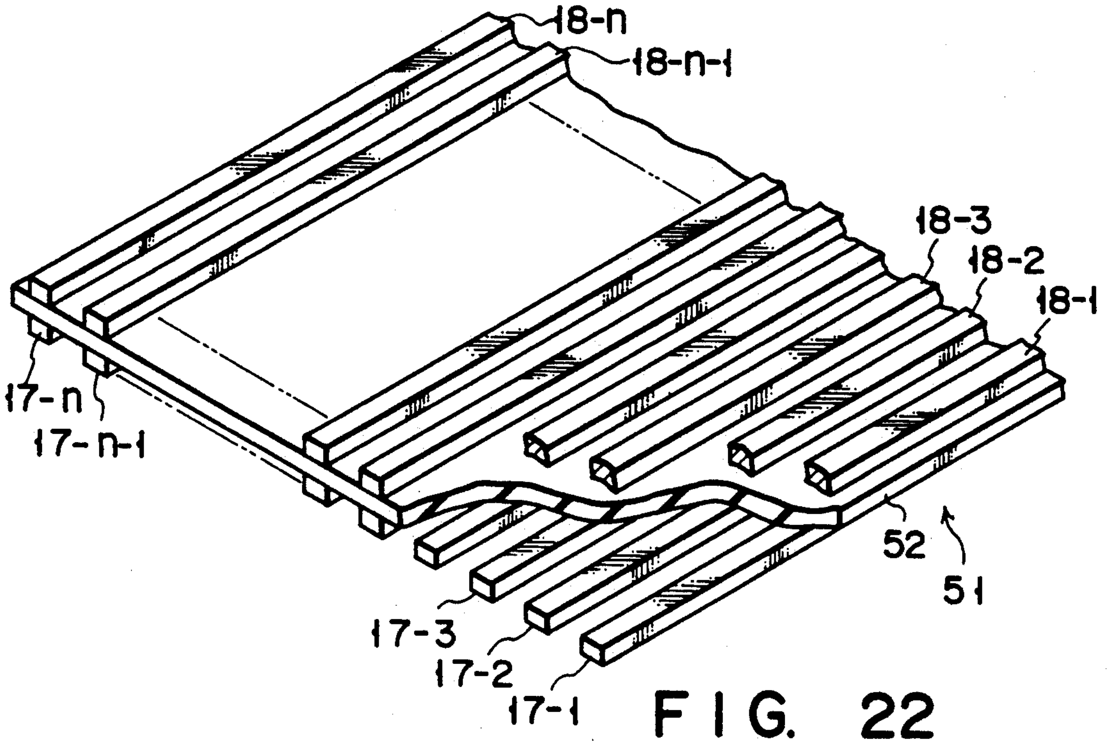
FIG. 22 is a perspective view of a flexible printed circuit board according to a first modification of the fourth embodiment of the present invention.

FIG. 22 shows a first modification of the fourth embodiment. In this modification, FPC 51 includes insulating layer 52, a plurality of signal conductive members 17-l to 17-n arranged in a row at one side of insulating layer 52, and a plurality of earth conductive members 18-l to 18-n arranged at the other side thereof. These conductive members are connected to signal and earth electrodes. In this modification, the crosstalk of the above two types can be prevented.

Figure 23:
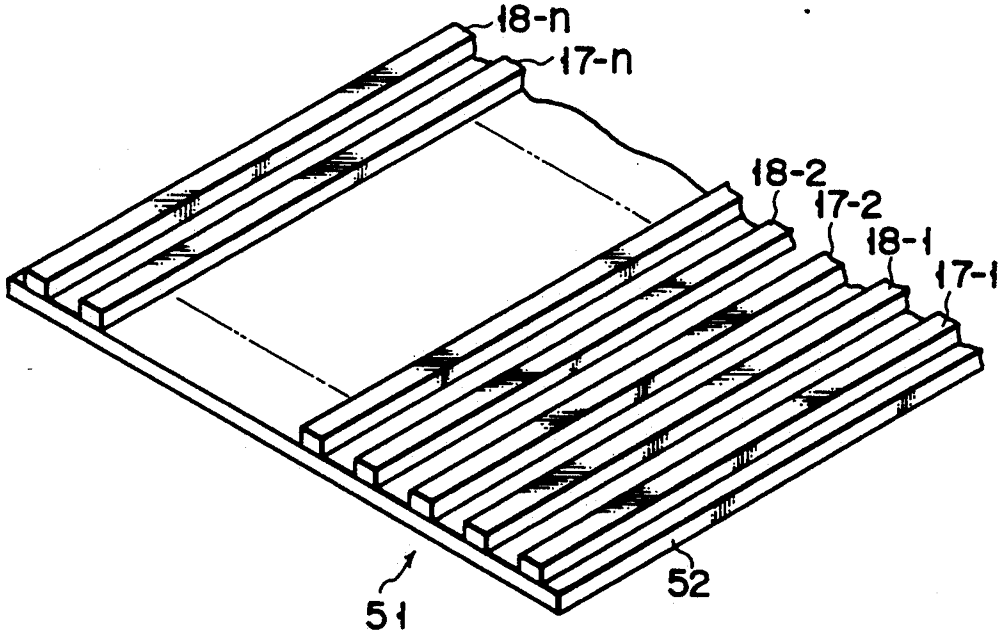
FIG. 23 is a perspective view of a flexible printed circuit board according to a second modification of the fourth embodiment of the present invention.

FIG. 23 shows a second modification of the fourth embodiment. Signal conductive members 17-l to 17-n and earth conductive members 18-l to 18-n are alternately arranged at one side of insulating layer 52 on FPC 51. In this modification, the crosstalk of the two types can be prevented. In addition, since the conductive members are arranged at one side of the insulating layer, the FPC can be easily manufactured and can be made thinner.

What is claimed is:

1. An ultrasonic probe to be connected to a transmitter/receiver which transmits driving signals to said probe and receives echo signals from said probe, said probe comprising:

an ultrasonic transducer element structure including a plurality of ultrasonic transducer elements which are electrically isolated from each other and arranged adjacent to each other in a row, each transducer element for generating an ultrasonic wave toward an examined object at times when the driving signals are applied to the element, and for receiving an echo ultrasonic wave from the examined object for generating the echo signal, wherein each transducer element has opposite sides;

a plurality of signal electrodes arranged adjacent to each other and corresponding to the transducer elements, each signal electrode provided on one side of a corresponding transducer element for applying the driving signals to the element and receiving the echo signals from the element;

an earth electrode having an inner surface provided on the other side opposite to said one side of at least one of the ultrasonic transducer elements and having an outer flat surface which opposes the inner surface and faces the echo wave;

a plurality of signal conductive members for leading the driving signals from the transmitter/receiver to corresponding signal electrodes and the echo signals to the transmitter/receiver, said plurality of signal conductive members being disposed substantially in a planar, coextensive relationship with adjacent signal conductive members having distal end portion in lapped electrical connection with edge portions of adjacent signal electrodes; and an earth conductive member for earthing said earth electrode and having an end portion in lapped electrical connection with an edge portion of said earth electrode and a conductive portion electrically isolated from said signal conductive members and extending proximally along at least one of said signal conductive members to limit a mutual inductance between at least two said signal conductive members.

2. An ultrasonic probe according to claim 1, wherein:

said earth electrode is divided in correspondence to a plurality of said transducer elements, and said earth conductive member is divided in correspondence to said plurality of said transducer elements.

3. An ultrasonic probe according to claim 1, further comprising: a flexible printed circuit board having: an insulating layer; a plurality of said signal conductive members arranged at one side of said insulating layer; and a plurality of said divided earth conductive members arranged at the other side of said insulating layer.

4. An ultrasonic probe according to claim 1, further comprising: a flexible printed circuit board having: an insulating layer; a plurality of said signal conductive members arranged at one side of said insulating layer; and a plurality of said divided earth conductive members arranged at the same side of said insulating layer, and wherein said signal and earth conductive members are alternately arranged.

5. An ultrasonic probe according to claim 1, wherein the connected end portion of the earth conductive member is located on a transducer element side that is different from both the one side and the other side of the transducer element.

6. An ultrasonic probe for connection to a transmitter/receiver which transmits driving signals to said probe and receives echo signals from said probe, said probe comprising:

an ultrasonic transducer element structure including a plurality of ultrasonic transducer elements which are electrically isolated from each other and arranged adjacent to each other in a row, each transducer element for generating an ultrasonic wave toward an examined object at times when the driving signals are applied to the element, and for receiving an echo ultrasonic wave from the examined object for generating the echo signal, wherein each transducer element has first and second opposite sides;

a plurality of signal electrodes arranged adjacent to each other and corresponding to the ultrasonic transducer elements, each signal electrode provided on the first side of a corresponding ultrasonic transducer element for applying the driving signals to the element and receiving the echo signals from the element;

an earth electrode having an inner surface provided on the second side opposite to the first side of at least one of the ultrasonic transducer elements and having an outer flat surface which opposes the inner surface and faces the echo wave;

a plurality of signal conductive members for conducting the driving signals from the transmitter/receiver to the signal electrode and the echo signals to the transmitter/receiver, said plurality of signal conductive members being substantially disposed in a planar relationship with adjacent signal conductive members being electrically connected to adjacent signal electrodes;

a backing member adhered to said plurality of signal electrodes for absorbing unnecessary ultrasonic waves generated by said plurality of ultrasonic transducer elements; and an earth conductive member for earthing said earth electrode, electrically connected to said earth electrode and electrically isolated from said signal conductive members, said earth conductive member including a first planar member electrically connected to said earth electrode at a first end and substantially adjacent to said backing member, a second planar member connected to a second end of said first planar member, and a third planar member, substantially adjacent to said backing member, connected to said second planar member and extending proximally along at least one of said signal conductive members to limit a mutual inductance between at least two said signal conductive members.

7. An ultrasonic probe for connection to a transmitter/receiver which transmits driving signals to said probe and receives echo signals from said probe, said probe comprising:

an ultrasonic transducer element structure including a plurality of ultrasonic transducer elements which are electrically isolated from each other and arranged adjacent to each other in a row, each transducer element for generating an ultrasonic wave toward an examined object at times when the driving signals are applied to the element, and for receiving an echo ultrasonic wave from the examined object for generating the echo signal, wherein each ultrasonic transducer element has first and second opposite sides;

a plurality of signal electrodes arranged adjacent to each other and corresponding to the transducer elements, each signal electrode provided on the first side of a corresponding ultrasonic transducer element for applying the driving signals to the element and receiving the echo signals from the ultrasonic transducer element;

an earth electrode having an inner surface provided on the second side opposite to the first side of at least one of the ultrasonic transducer elements and having an outer flat surface which opposes the inner surface and faces the echo wave;

a plurality of signal conductive members for conducting the driving signals from the transmitter/receiver to the signal electrode and the echo signals to the transmitter/receiver, said plurality of signal conductive members being substantially disposed in a planar relationship with adjacent signal conductive members being electrically connected to adjacent signal electrodes;

a backing member adhered to said plurality of signal electrodes for absorbing unnecessary ultrasonic waves generated by said plurality of ultrasonic transducer elements; and an earth conductive member for earthing said earth electrode, electrically connected to said earth electrode and electrically isolated from said signal conductive members, said earth conductive member including a first planar member electrically connected to said earth electrode at a first end, a portion of said first planar member being adjacent to said backing member, a second planar member connected to an intermediate portion of said first planar member, and a third planar member, substantially adjacent to said backing member, connected to said second planar member and extending proximally along at least one of said signal conductive members to limit a mutual inductance between at least two said signal conductive members.

8. An ultrasonic probe for connection to a transmitter/receiver which transmits driving signals to said probe and receives echo signals from said probe, said probe comprising:

an ultrasonic transducer element structure including a plurality of ultrasonic transducer elements which are electrically isolated from each other and arranged adjacent to each other in a row, each ultrasonic transducer element for generating an ultrasonic wave toward an examined object at times when the driving signals are applied to the element, and for receiving an echo ultrasonic wave from the examined object for generating the echo signal, wherein each ultrasonic transducer element has first and second opposite sides;

a plurality of signal electrodes arranged adjacent to each other and corresponding to the ultrasonic transducer elements, each signal electrode provided on the first side of a corresponding ultrasonic transducer element for applying the driving signals to the element and receiving the echo signals from the element;

an earth electrode having an inner surface provided on the second side opposite to the first side of at least one of the ultrasonic transducer elements and having an outer flat surface which opposes the inner surface and faces the echo wave;

a plurality of signal conductive members for conducting the driving signals from the transmitter/-receiver to the signal electrode and the echo signals to the transmitter/receiver, said plurality of signal conductive members being substantially disposed in a planar relationship with adjacent signal conductive members being electrically connected to adjacent signal electrodes;

a backing member adhered to said plurality of signal electrodes for absorbing unnecessary ultrasonic waves generated by said plurality of ultrasonic transducer elements; and an earth conductive member for earthing said earth electrode, electrically connected to said earth electrode and electrically isolated from said signal conductive members, said earth conductive member including a first planar member electrically connected to said earth electrode at a first end, a portion of said first planar member being adjacent to said backing member, a second planar member connected to a second end of said first planar member, and a third planar member connected to said second planar member and extending proximally along at least one of said signal conductive members to limit a mutual inductance between at least two said signal conductive members, a portion of said third planar member being adjacent to said backing member.

* * * * *

UNITED STATES PATENT AND TRADEMARK OFFICE

CERTIFICATE OF CORRECTION

PATENT NO. : 5,296,777

DATED : March 22, 1994

INVENTOR(S) : Yoshitaka Mine et al.

It is certified that error appears in the above-indentified patent and that said Letters Patent is hereby corrected as shown below:

Claim 1, column 10, line 61, change "portion" to --portions--.

Claim 7, column 12, line 23, after "each" (second occurrence) insert --ultrasonic--.

Signed and Sealed this

Twenty-seventh Day of December, 1994

Attest:

BRUCE LEHMAN

*Attesting Officer* | *Commissioner of Patents and Trademarks*